United States Patent [19]

Bullock et al.

[11] Patent Number: 4,665,358
[45] Date of Patent: May 12, 1987

[54] SOLID STATE ELECTRONIC PULSE SCALER USING RATIO OF TWO INTEGERS

[75] Inventors: Donald F. Bullock, Somersworth, N.H.; Francois Y. Simon, Raleigh, N.C.; Richard G. Farnsworth, York, Me.

[73] Assignee: General Electric Company, Somersworth, N.H.

[21] Appl. No.: 737,074

[22] Filed: May 23, 1985

[51] Int. Cl.[4] .................. G01R 11/63; G01R 1/38; G01R 23/00; H03K 21/00
[52] U.S. Cl. .................. 324/103 R; 324/116; 324/142; 364/483; 377/47
[58] Field of Search .................. 324/103 R, 132, 137, 324/116, 142, 113, 99 D; 364/483, 701, 754, 761; 307/518, 521; 377/47, 48, 118, 26, 39, 42, 52; 455/131; 328/160, 161

[56] References Cited

U.S. PATENT DOCUMENTS

| | | | |
|---|---|---|---|
| 3,617,885 | 11/1971 | Wheable | 324/99 D |
| 3,828,255 | 8/1974 | Schuon | 324/99 D |
| 4,034,292 | 7/1977 | McClelland, III | 324/157 |
| 4,415,853 | 11/1983 | Fisher | 324/113 |
| 4,425,579 | 1/1984 | Merrell | 455/131 |

Primary Examiner—Reinhard J. Eisenzopf
Assistant Examiner—Vinh P. Nguyen
Attorney, Agent, or Firm—Robert E. Brunson; Thomas R. Morrison

[57] ABSTRACT

A solid state electronic pulse scaler uses the ratio of two integers to control a ratio of its input and output frequencies. In one embodiment, the pulse scaler is used as a calibration device to adjust for manufacturing tolerances in an electric metering device. In another embodiment, the pulse scaler is used to provide a pulse-initiator output to external circuits. A further embodiment includes both of the above functions in a single device. A switch-selectable control is provided to determine the consequences of input pulses generated during reverse rotation of a meter disk. The reverse pulses may be used to generate output pulses on the same, or a separate, channel as that employed for forward pulses, ignored, or temporarily stored and subtracted from ensuing forward pulses.

18 Claims, 9 Drawing Figures

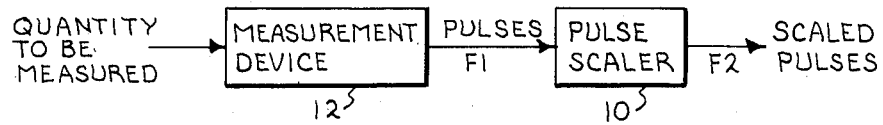
FIG.1
FIG.3A
FIG.3B
STATE  00 | 01 | 11 | 10 | 00 | 01 | 11 | 10 | 00 |
FIG.3C
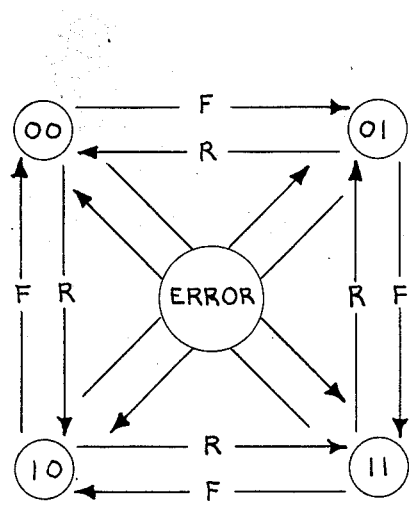
FIG.4

SOLID STATE ELECTRONIC PULSE SCALER USING RATIO OF TWO INTEGERS

BACKGROUND OF THE INVENTION

The present invention relates to measurement apparatus and, more particularly, to measurement apparatus in which a measured quantity can be characterized by a frequency of an alternating signal.

Apparatus for generating pulses having a frequency related to a measured quantity are in routine use. For example, certain electric meters contain pulse initiators which produce output pulses at a frequency having a desired relationship to the power usage being measured. An output pulse may be generated, for example, in response to the consumption of 1 KWh, or any other desired quantity. Such output pulses are useable both by the utility and by the energy consumer for monitoring, recording or communicating the energy usage at substantially shorter intervals than is normally possible in the routine monthly reading of an electric meter. When combined with a clock, such pulses can be the basis of a time-of-use or demand metering system in which different tariffs are applied depending on the time of day and/or day of the week during which the consumption occurs or on the energy usage rate.

A conventional electric meter employs a rotor disk, typically of aluminum, driven at a speed proportional to the energy usage by rotating magnetic fields generated by voltage and current coils in the load circuit. The disk shaft is geared to a mechanical register for integrating energy usage and optionally energy demand over specified demand intervals. In addition, the disk shaft may be geared to a mechanical cam, photo-optical sensor or other rotation-sensing device, for mechanically or electromechanically opening and closing the contacts of a relay. The relay contact closures are made available on external connections.

The gear ratio between the disk shaft and the rotation-sensing device determines the relationship between the disk rotation frequency and the output pulse frequency. Utilities usually desire that the significance of the output pulses have one of a substantial number of different quantities. For example, utilities may wish to choose between 1, 10, 100 or 1000 KWh, or other quantity per pulse. As is well known, an electric meter may be required to measure power usage at any one of several different voltages over a number of different load current ranges. Furthermore, the relationships between load current and voltage, and the current and voltage applied to the electric meter, may be modified by current and voltage transformers interposed between the load circuit and the meter. Each combination of the above variables requires a different gear ratio for driving the cam. Each different gear ratio requires a different mechanical design. In order to supply a reasonable number of customer requirements, a stock of up to several hundred gear assemblies may be required. This represents a significant cost in designing, manufacturing in short runs, stocking, cataloging and administration. In addition, since each gear ratio represents a unique design, once a particular gear ratio is installed in a meter during manufacture, no simple way is available to change the ratio in the factory or the field without major disassembly and reassembly of the meter. As a consequence, custom manufacture, with its increased costs and lengthened delivery times, must be employed to meet many customer requirements.

In the ideal, pulse initiator portions in all meters would be identical and the ratios would be defined in a simple and inexpensive operation after manufacture, either prior to shipping or after receipt by the utility. Also, it is most desirable that provision be included for adding the pulse initiator to a meter not previously containing one and that the pulse input-output ratio can be defined in the added pulse initiator.

In practice, an electro-mechanical electric meter can experience reverse rotation of the rotor disk due to drift under the influence of stray magnetic fields at no load, or due to reverse flow of current. The drift is usually arrested within one turn by an anti-creep hole purposely formed in the disk to lock the disk in a fixed rotational position until dislodged therefrom by a substantial torque attendant to the resumption of energy usage by the load. During the reverse disk rotation, in order to reach the point at which the anti-creep hole restrains further reverse rotation, a conventional pulse initiator may generate one or more spurious pulses. Such spurious pulse generation is avoided by a mechanical ratchet device which prevents reverse disk rotation or reverse rotation of the pulse-initiator cam. Such a mechanical ratchet device may add an undesired frictional retarding force during forward operation.

Reverse flow of current may occur, for example, in an intertie between two power grids wherein one of the two grids is at times a supplier, and at other times a receiver, of power over the same circuit. In such a circumstance, the reverse rotation of the meter disk has economic significance which should not be ignored. One way of separately capturing the bi-directional power flow may include the use of two separate meters, each having a mechanical ratchet to prevent reverse rotation. One of the two meters is connected for forward rotation by power flow in one direction and the other is connected for forward rotation by power flow in the opposite direction. A further source of reverse flow may result from tampering by removal and reversal of a meter for a portion of the interval between meter readings. Such reversal can decrement a meter or, if reverse rotation is prevented by a mechanical detent, it can prevent the proper incrementing of the meter and the generation of pulses by the pulse initiator. The prior art provides examples of inversion detection devices which, upon detecting the reversal of a meter, automatically reverse the direction of meter movement with respect to current flow thereby maintaining unidirectional register integration regardless of meter reversal. Such inversion detection devices add to the cost of manufacture.

An electronic pulse scaler performing as a pulse initiator for producing an output related to electric power consumption preferably takes the preceding factors governing reverse rotation into account.

Non-contact devices for sensing rotation of a shaft are disclosed in, for example, U.S. Pat. Nos. 3,943,498; 4,034,292 and 4,321,531 wherein optical sensors produce two phase-displaced signals in response to the passage therepast of reflective optical markings or apertures rotating with the meter disk. The relative phasing of the two signals is interpretable to distinguish between forward and reverse rotation of the disk. An improved optical detection sensing device is also disclosed in co-pending U.S. patent applications Ser. Nos. 550,142, now abandoned and 550,407, now abandoned. The disclosures of the referenced patents and application are herein incorporated by reference. The availability of data in electronic form regarding disk rotation simplifies the application of an electronic pulse scaler to produce output pulses related to the disk rotation by a predetermined factor. The recited patents, although they disclose electronic means for separating forward from reverse rotation, fail to contain disclosure of a scaling function except, in the case of the U.S. Pat. No. 3,943,498 patent, a direct submultiple division. Such a direct submultiple division is incapable of providing the very wide range of ratios required to serve virtually all the needs of utility customers.

Although the electro-mechanical electric meter has been developed into a reliable, durable and precise measurement instrument, an all-electronic meter, including both the measurement and the integration functions may become technically or economically desirable. An all-electronic meter measures the values of voltage and current using any one of several conventional electronic techniques, and electronically multiplies the voltage and current to produce an output having a characteristic which is variable in proportion to the product i.e. to the power. An electronic register integrates the resulting output which thereupon may be displayed or transmitted in a manner analogous to conventional electro-mechanical or hybrid electro-mechanical/electronic meters. One suitable output of the product of the current and voltage includes a pulse train whose frequency is variable in proportion to the product. The integration of usage then requires only the counting of pulses over a given period of time to derive the total power usage during the period.

Practical manufacturing of an electronic meter requires the use of electronic components which have tolerances varying from the exact values specified during the design of the product. Such electronic meters conventionally include adjustable elements, most commonly variable resistances, which are adjusted during final assembly of the electric meter to overcome errors due to component tolerances. Such adjustable elements are more prone to changes in value during use than are fixed-value components. Thus, the inclusion of adjustable elements for final calibration of an electronic meter sets the stage for later increases in the probability of error or failure after a period of service. Furthermore, the vernier adjustment of such adjustable elements is relatively difficult to automate during final assembly of the electric meter. Finally, the range of adjustment feasibly available with adjustable elements falls far short of the range necessary to accommodate the different voltage and current combinations employed by the utilities. As a consequence, the need remains to manufacture and stock a substantial number of different meters and/or voltage and current transformers to satisfy the needs of the buyers of all-electronic electric meters.

OBJECTS AND SUMMARY OF THE INVENTION

Accordingly, it is an object of the invention to provide a pulse scaler which overcomes the drawbacks of the prior art.

It is a further object of the invention to provide a pulse scaler which permits a wide range of ratios between its input and its output frequencies.

It is a still further object of the invention to provide a pulse scaler which scales its output frequency with respect to its input frequency according to the ratio of two integers.

It is a still further object of the invention to provide a pulse scaler having a selectable ability to ignore, separately process or algebraically sum pulses produced by forward and reverse current flow.

It is a still further object of the invention to provide a pulse scaler for final adjustment of an electric meter in which the adjustment is obtained by storing two integers, the ratio of which provides the scaling ratio.

Briefly stated, the present invention provides a solid state electronic pulse scaler which uses the ratio of two integers to control a ratio of its input and output frequencies. In one embodiment, the pulse scaler is used as a calibration device to adjust for manufacturing tolerances in an electric metering device. In another embodiment, the pulse scaler is used to provide a pulse-initiator output to external circuits. A further embodiment includes both of the above functions in a single device. A switch-selectable control is provided to determine the consequences of input pulses generated during reverse rotation of a meter disk. The reverse pulses may be used to generate output pulses on the same, or a separate, channel as that employed for forward pulses, ignored, or temporarily stored and subtracted from ensuing forward pulses.

According to an embodiment of the invention, there is provided a system for producing pulses having a first frequency related to a quantity comprising means for producing a second frequency related to the quantity, means for scaling the second frequency to produce the first frequency having a predetermined ratio with respect to the second frequency, the predetermined ratio including a ratio of first and second integers, non-volatile storage in the means for scaling and the non-volatile storage containing the first and second integers.

According to a feature of the invention, there is provided an electric meter comprising means for generating a first pulse signal at a first frequency related to a power consumed by a load, means for scaling the first frequency to produce a second pulse signal having a second frequency, the second frequency having a predetermined ratio with respect to the first frequency, the predetermined ratio including a ratio of first and second integers, non-volatile storage in the means for scaling, the non-volatile storage containing the first and second integers and a register for counting cycles of the second pulse signal whereby a consumption of the power is integrated.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a simplified block diagram of a pulse scaler processing output pulses from a measurement device.

FIGS. 3A and 3B are waveform drawings of the sine and cosine signals produced by the electric meter of FIG. 2.

FIG. 3C contains the states related to the waveforms of FIGS. 3A and 3B,

FIG. 4 shows the permitted and forbidden transitions between the states of FIG. 3C from which the direction of motion of the disk of FIG. 2 is determined.

DETAILED DESCRIPTION OF THE PREFERRED EMBODIMENT

Referring to FIG. 1, a pulse scaler 10 receives pulsed data at a frequency F1 from a measurement device 12 and produces scaled output pulses at a frequency F2. It is preferable that the frequency of F2 be related to the frequency of F1 by a ratio of integers. That is $F2 = F1 \times (N2/N1)$, where N1 and N2 are integers. Such a relationship, depending on the ratio of two integers, corresponds to the integral gear ratios of the prior art. Such integral ratios avoid the accumulation of systematic errors which may be produced by attempting to scale the frequencies by a fractional binary numeral.

Figure 2:
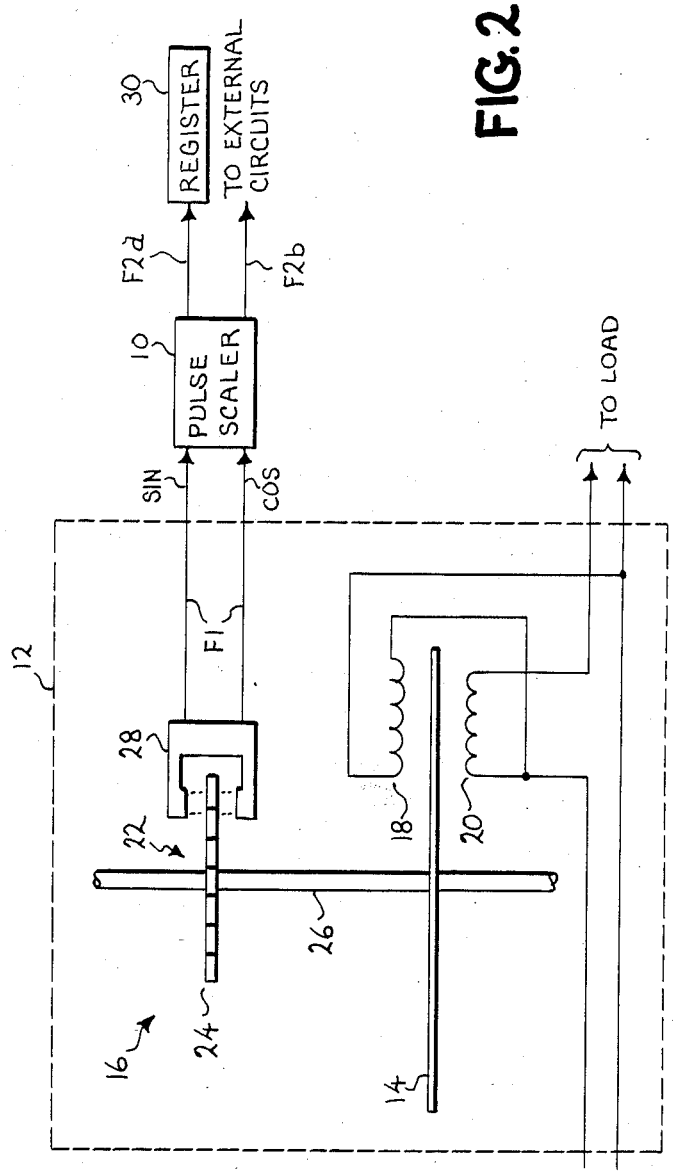
FIG. 2 is a simplified schematic diagram of portions of an electric meter including an embodiment of the invention.

Measurement device 12 may be any convenient device capable of producing pulses having a frequency responsive to the measured quantity. Referring to FIG. 2, for example, measurement device 12 may be a conventional meter disk 14 of an electric meter 16. Meter disk 14 is rotated, at a speed proportional to the electric power consumed by a load, by the rotating electric field generated by a voltage coil 18 and a current coil 20. A rotation transducer 22, which may be of any convenient type including one of the types disclosed in the referenced patents and patent application, includes a rotating element 24 rotating with a shaft 26 of meter disk 14 and a stationary sensor 28. Rotating element 24 and sensor 28 may be any convenient devices capable of producing an output signal in response to rotation of shaft 26. In the preferred embodiment, sensor 28 is an optical sensor which projects a beam of light toward rotating element 24, and rotating element 24 contains a series of alternating opaque and transparent areas capable of producing a varying signal in sensor 28 as they rotate therepast. Rotating element 24 may alternatively be areas of differing reflectivity, or areas of opacity and transparency on meter disk 14. A suitable combination of rotating element 24 and sensor 28 is preferably employed to provide two signals to pulse scaler 10 which have a predetermined phase relationship. Although the signals from sensor 28 are preferably rectangular pulses, the phase relationships of the two signals applied to pulse scaler 10 are displaced 90 degrees in phase with respect to each other. Such two signals are conventionally referred to as sin and cos signals to denote this phase relationship even though it is recognized that the square waveforms thereof do not include the smooth shapes conventionally associated with sine and cosine waveforms.

The pulse signals at a frequency F1 from sensor 28 are reduced in frequency by pulse scaler 10 by a ratio of two integers N2/N1 to produce a first output signal F2a which is applied to a register 30 wherein the number of pulses received is counted to produce an ascending stored value proportional to the amount of electric power consumed by the load. Register 30 may be any conventional counting device such as, for example, an electronic counter or an electro-mechanical counter. Register 30 may have suitable conventional display and resetting devices such as disclosed in U.S. Pat. No. 4,620,150, the disclosure of which is herein incorporated by reference. Since such display and resetting devices are conventional, and do not comprise an inventive part of the present disclosure, further illustration and description thereof is omitted.

Referring now to FIGS. 3A and 3B, the sin (FIG. 3A) and cos (FIG. 3B) signals fed to pulse scaler 10 (FIGS. 1 and 2) are shown. FIG. 3C shows a two-bit binary number formed by the instantaneous conditions of the sin and cos signals of FIGS. 3A and 3B, with the sin signal condition on the left. A more positive signal condition is taken as a binary 1 and a more negative signal condition is taken as a binary 0. It will be noted that four distinct unique states are discernable within one complete cycle of the sin or cos signals. The sequence in which these states occur differs during forward rotation of rotating element 24 as compared to reverse rotation. That is, during forward rotation (left to right in FIGS. 3A and 3B), the repeating state sequence 00, 01, 11 and 10 is seen whereas during reverse rotation, the right-to-left different repeating state sequence 10, 11, 01 and 00 is produced. These unique state sequences make it possible to determine the direction of rotation of meter disk 14 whenever a transition between 0 and 1 or between 1 and 0 occurs in either signal by comparing the new state with the prior state. The state sequences for forward and reverse motion are illustrated in FIG. 4 with forward motion indicated by F and reverse motion indicated by R. It will be noted that direction transition between states 01 and 10, and between states 00 and 11 are prohibited and detection of such prohibited transitions is interpreted as an error.

In an all-electronic system, it may be necessary to perform two separate operations on the output of measurement device 12. The first operation calibrates measurement device 12 to compensate for manufacturing tolerances in its components. The second operation adapts the system to the particulars of its installation, including the voltage and current at which the line operates and the significance of each output pulse with respect to power consumed. These separate operations are quite distinct. Calibration generally requires the use of closely spaced calibration points contained within a range of only a few percent of a nominal value, whereas scaling for a normal pulse constant Kd may need to be performed over a wide range of values covering several orders of magnitude.

Referring again to FIGS. 1 and 2, pulse scaler 10 applies conventional pulse constant Kd to the output of measurement device 12, before feeding the scaled signal to a register 30 for integrating energy usage. A similar scaling technique may also be used in pulse scaler 10 for applying the closely spaced calibration points to permit the selecting of the appropriate calibration point to eliminate errors due to inherent tolerances in mechanical, electromechanical or electronic components in measurement device 12. To carry out both operations, one embodiment of pulse scaler 10 includes a pair of cascaded pulse scalers (not shown), one of which is optimized for very fine adjustment over a small adjustment range to compensate for manufacturing tolerances and the other of which is optimized for less fine adjustment to apply pulse constant Kd.

Still referring to FIG. 2, pulse scaler 10 may further produce a second output at a frequency F2b for use by external circuits. For example, the frequency F2b may be scaled to produce output pulses corresponding to those produced by a conventional pulse initiator. Such output pulses may signify, for example, units, tens, hundreds or other units of kilowatt hours, or may have other significance. As will be detailed hereinafter, the ability of pulse scaler 10 to relate its input and output frequencies by the ratio of two integers permits use of an exact analogy of a gear ratio. Thus, the exact gear ratios used in driving pulse initiators of the prior art can be electronically simulated.

Figure 5:
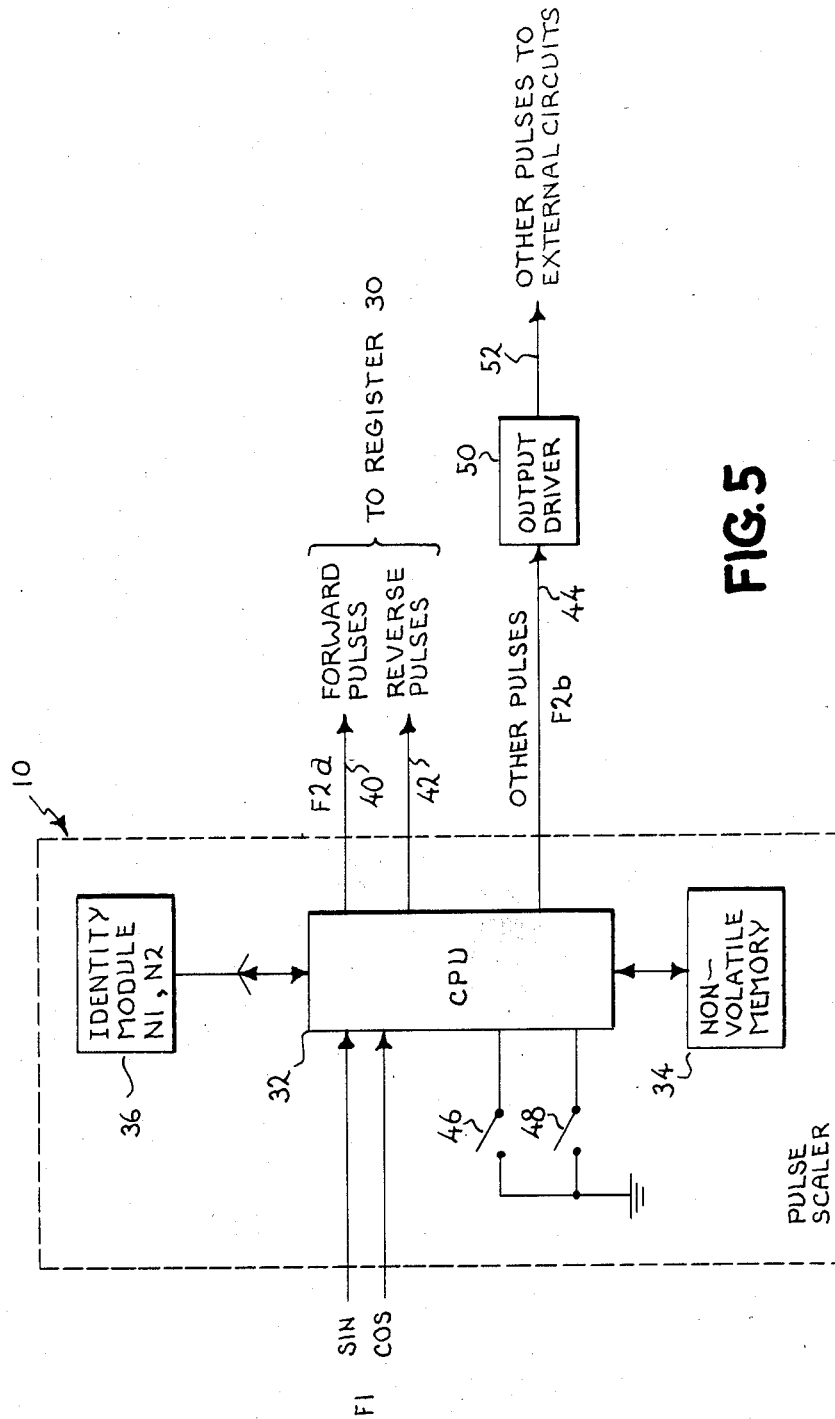
FIG. 5 is a simplified schematic diagram of a pulse scaler according to an embodiment of the invention.

Referring now to FIG. 5, a first embodiment of pulse scaler 10 is shown having a central processing unit 32 which may be any convenient type of digital processor and, more preferably, a microcomputer. One type of microcomputer which may be used in central processing unit 32 includes an NEC 7507S microcomputer made by NEC. A non-volatile memory 34, which may be part of central processing unit 32 or separate as shown, is included in pulse scaler 10 for containing the program for scaling the pulse frequencies. Non-volatile memory 34 may be any convenient device such as, for example a read-only memory or programmable read-only memory to store the required program in a non-volatile fashion capable of surviving a loss of power for lengthy periods of time when the apparatus within which pulse scaler 10 is installed is out of service. Such lengthy periods may include storage by the manufacturer or buyer before initial installation and may further include periods during which the apparatus is out of service due to maintenance. For these reasons, true non-volatility is preferred rather than battery-backed volatile random-access memory which retains its data when power is lost by relying on an associated battery. The avoidance of batteries is also desirable because of the maintenance problems inherent in the finite lifetimes of batteries. In the preferred embodiment, non-volatile memory 34 is an electrically erasable programmable read only memory which is programmable by conventional programming devices, called burners, and which, once programmed, is capable of retaining the stored data indefinitely. One suitable type of apparatus for non-volatile memory 34 includes a 256-bit non-volatile memory obtainable commercially under the designation NSC 9306.

An identity 36, containing information sufficient to identify the two integers N1 and N2, through which central processing unit 32 scales its output is interfaced to central processing unit 32. Identity module 36 may be of any convenient type capable of non-volatile storage of the necessary integers. Identity module 36 is preferably a type of device which can be easily added to a standard pulse scaler 10 after manufacture, either by the manufacturer or the buyer. Identity module 36 should be low in cost, be capable of containing the full range of scaling integers required to satisfy substantially all needs of utilities and be easy to program with the required integers. Identity module 36 may be, for example, a set of ON-OFF switches plug-connectable to central processing unit 32. The integers are selected by setting the ON-OFF switches into a desired pattern to select their binary equivalent. Alternatively, identity module 36 may be a jumpered plug which applies ground and/or voltages to particular inputs of central processing unit 32 to designate integers N1 and N2. In a preferred embodiment, identity module 36 is a mechanically programmed 9-bit switch device. Connections between pins which exist in the unprogrammed state may be mechanically broken by a punch device, to program any of the nine bits thereof, as desired.

In a most preferred embodiment of the invention, non-volatile memory 34 may contain a lookup table in which a standard set of integers N1 and N2 may be stored. Identity module 36, instead of identifying the integers N1 and N2 themselves, identifies the address at which the desired pair of integers N1 and N2 is stored. For example, a range of conventional meters may employ about 500 different gear ratios for obtaining virtually all of the desired relationships between input and output frequencies. Thus, a lookup table in non-volatile memory 34 containing about 500 pairs of integers N1 and N2 is sufficient to cover most of the requirements. Since a nine-bit digital number is capable of uniquely identifying 512 different addresses in non-volatile memory 34, an identity module having this capacity is preferred.

Each time pulse scaler 10 is powered up, central processing unit 32 reads in the program from non-volatile memory 34 and the identity, or address, of integers N1 and N2 from identity module 36. In installations where it is important to avoid loss of billing data due to a power outage, apparatus (not shown) may be provided for storing such billing data from central processing unit 32 into non-volatile memory 34 upon detection of an impending power outage and for reading the billing data from non-volatile memory 34 upon the resumption of normal conditions. Apparatus for performing such storage and reading of billing data is disclosed in U.S. patent application Ser. No. 599,743, the disclosure of which is herein incorporated by reference. Since the storage and reading of such billing data during power outages does not form an inventive part of the present disclosure, further description thereof is omitted.

Although identity module 36 may identify only a single pair of integers N1 and N2 as indicated, it may alternatively further identify additional pairs of integers to be used by central processing unit 32 for additional scaling based on the same incoming pulse signals at frequency F1. Thus, two output frequencies F2a and F2b may be produced having different scaled relationships to input frequency F1. Frequency F2a, which may be applied on lines 40 and 42 to register 30 (FIG. 2), may be very finely variable over a small range for correcting tolerances in electric meter 16. The signal on line 40 may be pulses of frequency F2a resulting from forward rotation of meter disk 14 (FIG. 2) and the signal on line 42 may be pulses of frequency F2a resulting from reverse rotation of meter disk 14. Alternatively, line 40 may contain pulses produced by either direction of rotation of meter disk 14, or it may contain pulses produced by forward rotation of meter disk 14 but reduced in number by adding the pulses due to reverse rotation and decrementing those pulses by an equal number of forward-rotation pulses before resuming the production of pulses on line 40. In a system employing the alternative techniques in the preceding sentence, line 42 may optionally be omitted. When such alternative is selected, however, line 42 may be retained, even if unused, in order to simplify manufacture.

Pulse scaler 10 may include programming switches 46 and 48 for determining the consequences of reverse rotation of meter disk 14 (FIG. 2). The options are given in the following tabulation in which an open condition of a switch is indicated by a 0 and a closed condition is indicated by a 1.

| SWITCH 46 | SWITCH 48 | LINE 40 | LINE 42 |
|---|---|---|---|
| 0 | 0 | Y PULSES ON LINE 40 | REV PULSES ON LINE 42 |
| 0 | 1 | Y PULSES ON LINE 40 | REV PULSES STORED AND SUBTRACTED FROM Y PULSES |
| 1 | 0 | Y PULSES ON LINE 40 | REV PULSES IGNORED |
| 1 | 1 | Y PULSES ON LINE 40 | REV PULSES ON LINE 40 |

The second output frequency F2b may be scalable over a wider range than output frequency F2a in order to satisfy the scaling needs of a pulse initiator. Output frequency F2b is applied on a line 44 to an output driver 50 for producing conventional K-Y-Z contact closures, or other types of output signals, for application on a line 52 to external circuits.

Figure 6:
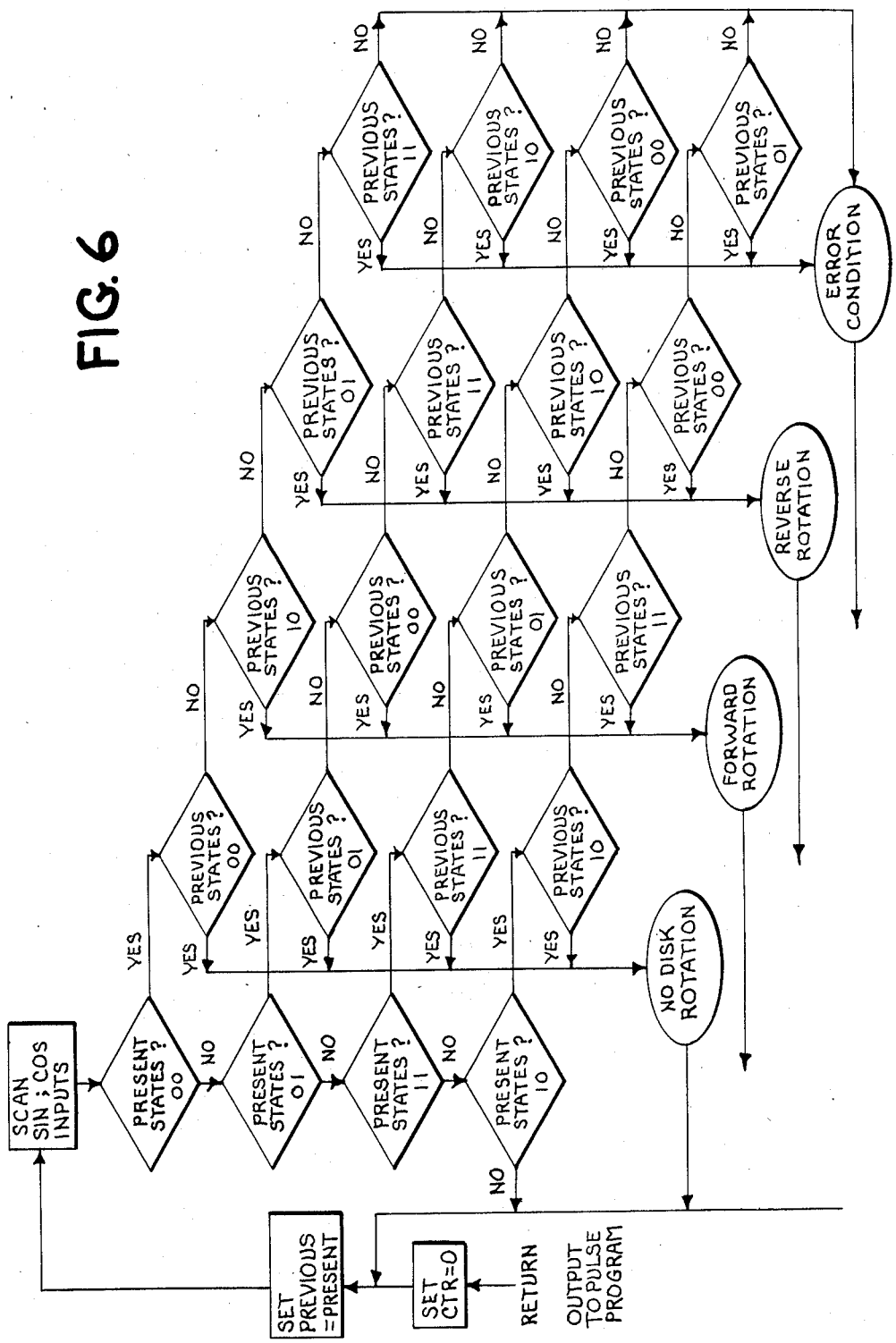
FIG. 6 is a flow diagram of a program for determining the direction of motion or the presence of a forbidden transition.

In order to avoid fractional residual errors, central processing unit 32, upon receiving each input pulse, checks to determine whether forward or reverse rotation produced the input pulse. The states illustrated in FIG. 4 are used in such determination. The logic for determining the direction of rotation by comparing the new and preceding states is shown in FIG. 6. Depending on the settings of programming switches 46 and 48, the detected rotation directions have the consequences outlined above. This logic is considered to be self-explanatory and will not be further described.

Assuming unidirectional forward rotation for the purposes of explanation, each time a pulse is detected, a value equal to integer N1 is added to a state register. Whenever the value in the state register exceeds the value of integer N2, the value of integer N2 is subtracted from the state register and an output pulse is generated. The programming sequence employed to perform the pulse scaling in pulse scaler 10 may be written in any convenient programming language, but is preferably written in a machine language appropriate to the particular central processing unit 32 employed. Since a higher-level language such as, for example, BASIC, is more easily understood and could be employed at the cost of substantial penalty in operating speed, the following simple BASIC program is included for completeness of description.

```
1  REM PROGRAM TO SCALE PULSES BY RATIO OF N1/N2
10 INPUT N1,N2     'READ IN INTEGER VALUES
15 INPUT X         'READ IN REMAINDER (OPTIONAL)
20 X$=INP(PORT#):IF X$="" THEN GOTO 20
   'CYCLE UNTIL INPUT PULSE RECEIVED
30 X=X+N1          'INCREMENT X BY N1
40 IF X>N2-1 THEN X=X-N2:GO TO 55
   'TEST FOR X>=N2, DECREMENT BY N2
45                 'AND CHANGE STATE
50 GOTO 20         'NO OUTPUT CHANGE
55 IF Z=0 THEN GO TO 70
60 IF Z=1 THEN     'CHANGE STATE 1-0
   Z=0
65 GO TO 80
70 IF Z=0 THEN     'CHANGE STATE 0-1
   Z=1
80 OUT(PORT#,Z)    'SEND STATE TO OUTPUT
90 GO TO 20        'RESUME CYCLING
```

Lines 10 and 15 are executed only at startup to read in the two scaling integers N1 and N2 and optionally to read in any remainder which may have existed at a power outage. Line 20 waits for a pulse to be received and, when one is received, line 30 increments a variable X by N1. Line 40 tests to determine whether X is equal to, or greater than, N2 and if it is, subtracts N2 from X and transfers operation to lines 55 through 90 which change the state of the output port and resume scanning at line 20. If the test in line 40 determines that X does not exceed integer N1, it returns the program to line 20 without producing a change in output state.

The above scaling technique provides precise integral scaling over an indefinite period of time. However, at least some of the state transitions may occur slightly later than they would if a non-integral multiplier were used for deciding the time at which the output state changes. The following example illustrates the difference.

For purposes of explanation, the following example assumes an electric meter which executes one revolution of its meter disk 14 per 7.2 watthours of electricity used. In a system having a rotation transducer 20 which generates six cycles of the sin and cos signals per revolution, a total of 24 detectable rotational states per revolution are generated (six cycles times four states per cycle). If it is desired to produce a change in output state F2 for each watt-hour of electricity usage, the required ratio of 3:10 may be chosen for integers N1 and N2 respectivly. Thus, each time a change of input state is detected, the value of X is increased by 3 and the remaining logic in the above program is executed. The following tabulation illustrates the conditions at each of the first 12 steps:

| STEP NO. | X | DOES OUTPUT STATE CHANGE |
|---|---|---|
| 0 | 0 | |
| 1 | 3 | NO |
| 2 | 6 | NO |
| 3 | 9 | NO |
| 4A | 12 | YES |
| 4B | 12−10=2 | |
| 5 | 5 | NO |
| 6 | 8 | NO |
| 7A | 11 | YES |
| 7B | 11−10=1 | |
| 8 | 4 | NO |
| 9 | 7 | NO |
| 10A | 10 | YES |
| 10B | 10−10=0 | |
| 11 | 3 | (SAME AS STEP 1) |

According to the preceding, except for every 11th input pulse, each change of output state occurs slightly later than it would if non-integral control were exercised for producing the output frequency F2. For most applications, this slight difference in output duty ratio is not of concern given the precision of the scaling offered by the present invention.

It would be clear to one skilled in the art that a single central processing unit 32 is capable of executing the foregoing simple program at a high rate compared to the rate at which input or output pulses are conventionally produced. Thus, central processing unit 32 is idle for a substantial portion of time. The idle periods may be employed to accomplish other functions such as, for example, those defined in the referenced patent applications. In addition, central processing unit 32 may have sufficient idle time to execute two identical programs which differ only in the particular integers N1 and N2 and in the output port to which the two resulting scaled frequencies are directed. In this way, a single central processing unit 32 may be able to perform the scaling required to generate both frequency F2a and frequency F2b.

In addition to the double execution of the scaler program discussed in the preceding, central processing unit 32 may apply a calibration scaling factor to frequency F1 before it is employed by the above scaler program to generate output pulses. That is, a further pair of integers may be identified from among a dense set of calibration integer pairs. The above scaler program is then run on the calibration integer pairs. The resulting state changes produced by the calibration integer pairs are then used as the input to one or two more iterations of the scaler program to produce the output frequencies.

In a preferred embodiment of the invention, non-volatile memory 34 contains 511 standard pairs of integers N1 and N2, any pair of which may be selected by a nine-bit digital word. The nine-bit digital word may be stored in non-volatile memory 34 so that, if the particular installation is capable of using one of the standard pairs of integers N1 and N2, then no recourse to identity module 36 is needed. Identity module 36 may therefore be omitted when a standard integer pair is satisfactory for the installation. Thus, the address of the selected integer pair may be stored in non-volatile memory 34 after manufacture but before shipment from the manufacturer without requiring that the customer provide means for programming the system. A 512th address may be stored in non-volatile memory 34 indicating that none of the stored integer pairs is satisfactory. The 512th address identifies the address of the identity module or of a programmable memory location in non-volatile memory in which the non-standard integer pair is obtainable. In this case, any pair of integers may be identified.

Figure 7:
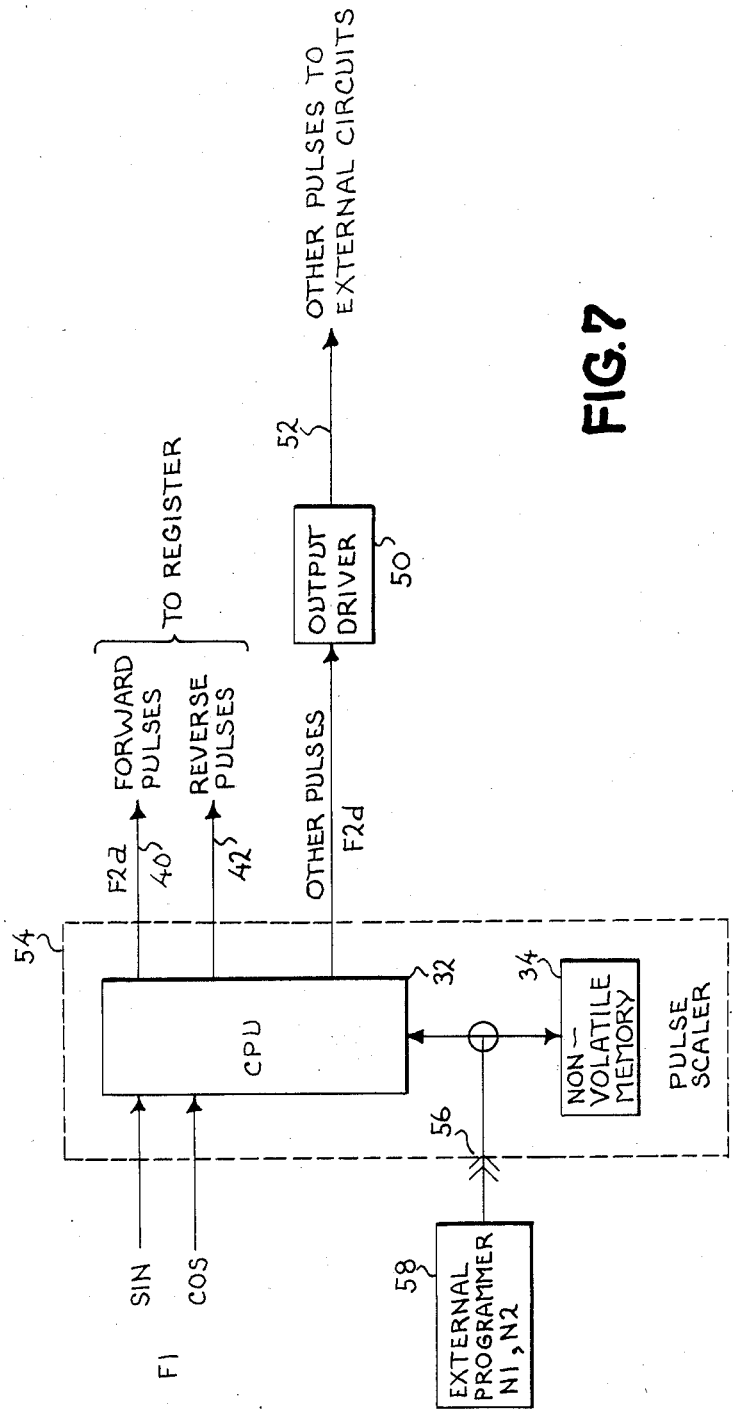
FIG. 7 is a simplified schematic diagram of a pulse scaler according to a further embodiment of the invention.

Referring now to FIG. 7, there is shown a pulse scaler 54 according to a further embodiment of the invention. A central processing unit 32 is connected to a non-volatile memory 34 for receiving not only the program and, optionally, the stored billing data, but also for receiving the identity or the address of scaling integers N1 and N2. That is, the embodiment of FIG. 7 eliminates the need for the identity module 36 of FIG. 5. This is enabled by providing an external programmer interface 56 which permits identifying the scaling constants N1 and N2 from a conventional external programmer 58. The functions of programming switches 46 and 48 of FIG. 5 may also be assumed by non-volatile memory 34. The two-bit digital value (or other larger number identifying a larger set of options) may be input to non-volatile memory 34 through external programmer interface 56. Central processing unit 32 treats the stored values identifying the output options in the same manner as it does the conditions of programming switches 46 and 48. With the embodiment of FIG. 7, all pulse scalers 54 may be identically manufactured and stocked. Customization for a particular meter or application can be easily performed at low cost prior to shipment from the manufacturer, or prior to installation by the utility. In addition, even after a pulse scaler 54 has been in service, it can be reprogrammed for a different scaling ratio or a different output option merely by reattaching an external programmer 58 to external programmer interface 56 for storing a new set of scaling integers N1 and N2 and output option values.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A system for producing pulses having a first frequency related to a quantity comprising:
   means for producing a second frequency related to said quantity;
   means for scaling said second frequency to produce said first frequency having a predetermined ratio with respect to said second frequency;
   said predetermined ratio including a ratio of selectable first and second integer constants;
   non-volatile storage in said means for scaling; and
   said non-volatile storage containing said first and second integer constants.

2. A system according to claim 1 wherein said non-volatile storage further includes means for programming said non-volatile storage whereby said first and second integer constants be changed.

3. A system according to claim 2 wherein said means for programming includes an identity module.

4. A system according to claim 3 wherein said identity module includes a jumpered plug.

5. A system according to claim 3 wherein said identity module includes a plurality of ON-OFF switches, said first and second integer constants being definable by combinations of positions of said plurality of ON-OFF switches.

6. A system according to claim 3 wherein said means for programming includes an electrically programmable read only memory and an external programmer connectable to said electrically programmable read only memory.

7. A system according to claim 1 wherein said means for scaling includes a digital computer.

8. A system according to claim 7 wherein said digital computer includes a microcomputer.

9. A system according to claim 7 wherein said digital computer includes means for incrementing, a variable by an amount equal to said first integer constant whenever one of said pulses at said first frequency is received, and said digital computer further includes means for decrementing said variable by said second integer constant when said variable exceeds said second integer, and said means for scaling further includes means for producing a change in an output each time said variable is decremented whereby said output is said first frequency.

10. A system according to claim 1 wherein said system further comprises second means for scaling said second frequency to produce a third frequency different from said first frequency, said third frequency having a second predetermined ratio with respect to said second frequency, said second predetermined ratio including a ratio of third and fourth integer constants.

11. A system according to claim 1 wherein said non-volatile storage contains a lookup table containing a plurality of pairs of said first and second integer constants, and said system further contains means for identifying an address of a desired one of said plurality of pairs.

12. A system according to claim 11 wherein said non-volatile storage contains at least one address which identifies a source for said first and second integer constants which is located external to said non-volatile storage.

13. A system according to claim 12 wherein said source is an identity module.

14. A system according to claim 12 wherein said source is an external programmer capable of storing said first and second integer constants in said non-volatile storage device.

15. A system according to claim 11 wherein said means for identifying an address includes a stored address in said non-volatile storage.

16. An electric meter comprising:
   means for generating a first pulse signal at a first frequency related to a power consumed by a load;
   means for scaling said first frequency to produce a second pulse signal having a second frequency;
   said second frequency having a predetermined ratio with respect to said first frequency;
   said predetermined ratio including a ratio of selectable first and second integer constants;
   non-volatile storage in said means for scaling;
   said non-volatile storage containing said first and second integer constants; and
   a register for counting cycles of said second pulse signal whereby a consumption of said power is integrated.

17. An electric meter according to claim 16 wherein said first pulse signal includes a forward signal indicating power flowing in a first direction and a reverse signal indicating power flowing in a second direction, and said electric meter includes means for selecting one of:
   ignoring said reverse signal;
   scaling both said forward signal and said reverse signal; and
   temporarily storing said reverse signal and subtracting it from said forward signal upon a resumption of power flowing in said forward direction.

18. An electric meter according to claim 17 wherein said means for selecting includes means effective when scaling both said forward and reverse signals for applying the scaled forward and reverse signals selectably on a single line or on separate lines.

* * * * *